(12) United States Patent
Khadilkar et al.

(10) Patent No.: US 8,236,598 B2
(45) Date of Patent: Aug. 7, 2012

(54) LAYERED CONTACT STRUCTURE FOR SOLAR CELLS

(75) Inventors: Chandrashekhar S. Khadilkar, Broadview Heights, OH (US); Srinivasan Sridharan, Strongsville, OH (US); Paul S. Seman, Parma Heights, OH (US); Aziz S. Shaikh, San Diego, CA (US)

(73) Assignee: Ferro Corporation, Cleveland, OH (US)

( * ) Notice: Subject to any disclaimer, the term of this patent is extended or adjusted under 35 U.S.C. 154(b) by 619 days.

(21) Appl. No.: 12/298,956

(22) PCT Filed: Aug. 29, 2008

(86) PCT No.: PCT/US2008/074711
§ 371 (c)(1),
(2), (4) Date: Dec. 4, 2008

(87) PCT Pub. No.: WO2009/029738
PCT Pub. Date: Mar. 5, 2009

(65) Prior Publication Data
US 2010/0173446 A1    Jul. 8, 2010

Related U.S. Application Data

(60) Provisional application No. 60/969,340, filed on Aug. 31, 2007.

(51) Int. Cl.
*H01L 21/00* (2006.01)

(52) U.S. Cl. ..... 438/72; 438/98; 136/256; 257/E31.124; 257/E21.477

(58) Field of Classification Search ........................ None
See application file for complete search history.

(56) References Cited

U.S. PATENT DOCUMENTS

| | | | |
|---|---|---|---|
| 3,839,231 A | | 10/1974 | Patterson et al. |
| 3,900,945 A | | 8/1975 | Kay et al. |
| 3,904,453 A | | 9/1975 | Revesz et al. |
| 4,088,502 A | | 5/1978 | La Bar |
| 4,163,678 A | | 8/1979 | Bube |
| 4,235,644 A | * | 11/1980 | Needes ........................ 136/256 |
| 4,400,214 A | | 8/1983 | Ogawa et al. |

(Continued)

FOREIGN PATENT DOCUMENTS

JP    58083073    5/1983

(Continued)

OTHER PUBLICATIONS

Kaydanova et al., "Direct Write Contacts for Solar Cells", Proceedings of the 31st IEEE Photovoltaic Specialists Conference, Orlando, USA, 2005; 1305-1308.*

(Continued)

*Primary Examiner* — Ha Tran T Nguyen
*Assistant Examiner* — Shaka Scarlett
(74) *Attorney, Agent, or Firm* — Rankin, Hill & Clark LLP

(57) ABSTRACT

Formulations and methods of making semiconductor devices and solar cell contacts are disclosed. The invention provides a method of making a semiconductor device or solar cell contact including ink-jet printing onto a silicon wafer an ink composition, typically including a high solids loading (20-80 wt %) of glass frit and preferably a conductive metal such as silver. The wafer is then fired such that the glass frit fuses to form a glass, thereby forming a contact layer to silicon.

9 Claims, 4 Drawing Sheets

U.S. PATENT DOCUMENTS

| | | | |
|---|---|---|---|
| 4,486,232 A | 12/1984 | Nakatani et al. |
| 5,008,151 A | 4/1991 | Tominaga et al. |
| 5,070,047 A | 12/1991 | Gardner et al. |
| 5,071,794 A | 12/1991 | Shaikh et al. |
| 5,074,920 A | 12/1991 | Gonsiorawski et al. |
| 5,118,362 A | 6/1992 | St. Angelo et al. |
| 5,120,579 A | 6/1992 | Gardner et al. |
| 5,151,377 A | 9/1992 | Hanoka et al. |
| 5,164,342 A | 11/1992 | Muralidhar et al. |
| 5,178,685 A | 1/1993 | Borenstein et al. |
| 5,198,154 A | 3/1993 | Yokoyama et al. |
| 5,397,830 A | 3/1995 | Shaikh et al. |
| 5,584,941 A | 12/1996 | Nishida |
| 5,637,156 A | 6/1997 | Kubota et al. |
| 5,698,451 A | 12/1997 | Hanoka |
| 5,714,246 A | 2/1998 | Shaikh et al. |
| 5,792,716 A | 8/1998 | Vasudevan et al. |
| 5,841,044 A | 11/1998 | Weise et al. |
| 5,897,912 A | 4/1999 | Shaikh |
| 5,942,048 A | 8/1999 | Fujisaki et al. |
| 5,948,320 A | 9/1999 | Nikaidoh et al. |
| 5,998,037 A | 12/1999 | Sridharan et al. |
| 6,036,889 A | 3/2000 | Kydd |
| 6,225,392 B1 | 5/2001 | Sunahara |
| RE37,512 E | 1/2002 | Szlufcik et al. |
| 6,469,243 B2 | 10/2002 | Yamanaka et al. |
| 6,576,391 B1 | 6/2003 | Iguchi et al. |
| 6,592,696 B1 | 7/2003 | Burdon et al. |
| 6,632,730 B1 | 10/2003 | Meier et al. |
| 6,664,631 B2 | 12/2003 | Meier et al. |
| 6,692,981 B2 | 2/2004 | Takato et al. |
| 6,710,239 B2 | 3/2004 | Tanaka |
| 6,814,795 B2 | 11/2004 | McVicker et al. |
| 6,936,556 B2 | 8/2005 | Sridharan et al. |
| 6,982,864 B1 | 1/2006 | Sridharan et al. |
| 7,176,152 B2 | 2/2007 | Brown et al. |
| 7,339,780 B2 | 3/2008 | Sridharan et al. |
| 2004/0016456 A1* | 1/2004 | Murozono et al. | 136/250 |
| 2004/0018931 A1 | 1/2004 | Sridharan et al. |
| 2005/0176164 A1 | 8/2005 | Gee et al. |
| 2005/0277550 A1 | 12/2005 | Brown et al. |
| 2006/0028788 A1 | 2/2006 | Sridharan et al. |
| 2006/0102228 A1* | 5/2006 | Sridharan et al. | 136/256 |
| 2006/0213870 A1 | 9/2006 | Waldrop et al. |
| 2006/0260734 A1 | 11/2006 | Brown et al. |
| 2006/0289055 A1 | 12/2006 | Sridharan et al. |
| 2007/0108423 A1 | 5/2007 | Brown et al. |
| 2007/0215202 A1 | 9/2007 | Salami et al. |
| 2008/0003364 A1* | 1/2008 | Ginley et al. | 427/276 |
| 2008/0053592 A1 | 3/2008 | Khadilkar et al. |
| 2008/0206488 A1* | 8/2008 | Chung et al. | 427/596 |
| 2008/0314444 A1* | 12/2008 | Kawaguchi | 136/256 |

FOREIGN PATENT DOCUMENTS

| WO | 2005/052071 | 6/2005 |
|---|---|---|

OTHER PUBLICATIONS

Definition of Plating—Merriam-Webster's dictionary 2011 (http://www.merriam-webster.com/dictionary/plating).* eSpace Patent Abstract for Japanese Publication No. JP58083073, Published May 18, 1983, One page.

Khadilkar et al., "Characterization of Front Contact in a Silicon Solar Cell", presented Aug. 10-13, 2003, 15 pages.

Shaikh et al., "Designing a Front Contact Ink for SiNx Coated Polycrystalline Si Solar Cells", presented May 11-18, 2003, 3 pages.

Surek, "Progress in U.S. Photovoltaics: Looking Back 30 Years and Looking Ahead 20", 3rd World Conference, Osaka, Japan, May 11-18, 2003, pp. 1-6.

International Search Report for Application No. PCT/US2008/074711 mailed Nov. 10, 2008, Two pages.

* cited by examiner

LAYERED CONTACT STRUCTURE FOR SOLAR CELLS

FIELD OF THE INVENTION

This invention relates to a method of making contacts for solar cells and the conductive inks used therein. In particular, the invention relates to a multilayer solar cell contact and a method of making of making the same involving a non contact printing of first layer such as ink-jet printing to build up the layers.

BACKGROUND

Commercial manufacturing of silicon-based solar cells involves several steps, including: (1) Cleaning of diced or melt grown Si wafers with a suitable etching solution. Wafers used are generally p-type with boron doping. (2) Phosphorus deposition and firing to form a layer with high phosphorus surface concentration (to a depth of about 0.3 to 0.5 microns. The firing is typically carried out at 800-950° C. for 10 to 120 minutes using a belt furnace. (3) Removal of phosphorous glass formed during firing. (4) Deposition of a thin anti-reflective/passivation coating, usually $SiN_X$, having a typical thickness of about 50-70 nm. (5) Deposition of front contacts using screen-printing or extrusion process using a front-contact paste. Front-contact pastes typically include silver and glass powders dispersed in a suitable organic vehicle system. (6) Deposition of back-contact silver and aluminum pastes using either screen-printing or pad-printing, and (7) Belt furnace firing of the front and back contact pastes at 600 to 1000° C. for a few seconds to few minutes.

SUMMARY OF THE INVENTION

The present invention provides a method of forming multilayer solar cell contacts wherein at least one layer is deposited on a silicon wafer by non contact printing methods such as ink jet printing. The contacts, and solar cells made therewith have low series resistance (Rs) and high shunt resistance ($R_{Sh}$) to give high performance solar cells, as measured by efficiency (η) and fill factor (FF).

Broadly, the invention includes methods of ink-jet printing onto a substrate: (1) an ink including a glass; (2) an ink including a glass and silver; (3) an ink including a glass and a transition metal other than silver; or (4) an ink including a glass and an etchant.

In particular, the present invention provides a method of making a solar cell contact including a contact layer and a bulk layer, the method comprising: (a) ink-jet printing, onto a silicon wafer, at least a portion of which bears an antireflective coating, an ink having a solids loading of about 20 wt % to about 80 wt %, the ink comprising (i) glass frit, having (1) an average particle size of less than about 3 microns and (2) a glass transition temperature of about 200° C. to about 700° C., and (b) firing the wafer, wherein the glass frit fuses to form a glass and forms a contact layer to silicon.

Another embodiment of the invention is a method of forming a solar cell contact, comprising ink jet printing, onto a silicon wafer bearing a partially etched antireflective coating, to form a first layer, an ink comprising: silver and a glass frit comprising oxides of at least one metal selected from the group consisting of Si, Pb, Bi, Al, Zn, B, Zr, Ti, Ta, P, alkali metals and alkaline earth metals, the glass frit having an average particle size of less than about 3 microns, and firing the wafer.

A third embodiment of the invention is a method of forming a solar cell contact comprising ink-jet printing, onto a silicon wafer, a first layer comprising a phosphorus composition; ink-jet printing a conductive ink onto at least a portion of the first layer; and firing the silicon wafer in air at a temperature less than about 970° C.

A fourth embodiment is a method of making a solar cell contact comprising: ink jet printing, on at least a portion of a silicon wafer, a first phosphorus layer comprising a plating solution comprising a phosphorus-compound and a solvent, evaporating the solvent from the plating solution, ink jet printing onto at least a portion of the first phosphorus layer, an ink comprising silver and glass frit, and firing the silicon wafer to fuse the frit.

A fifth embodiment of the invention is a method of making a solar cell contact comprising: ink jet printing, onto at least a portion of a silicon wafer, a plating solution comprising phosphorus and a solvent, evaporating the solvent, ink-jet printing, onto at least a portion of the phosphorus layer, a transition metal other than silver, firing the wafer to form a silicide, applying a silver-containing composition to the silicide, and firing the silver-containing composition to form a conductive path.

A sixth embodiment of the invention is a method of making a printed electronics circuit including a contact layer and a bulk layer, the method comprising: ink jet printing, onto a substrate, an ink layer having a solids loading of about 20 wt % to about 80 wt %, the ink comprising, glass frit, having an average particle size of less than about 3 microns and a glass transition temperature of about 200° C. to about 700° C., and firing the substrate, wherein the glass frit fuses to form a glass and to form a contact layer to the substrate.

It is to be noted that for every embodiment disclosed and claimed, where the phrase "selected from the group consisting of" is included, it is to be presumed that combinations from the list in question (such as elements, metals, oxides, other ingredients and process steps) are also disclosed and/or claimed. Unless specifically otherwise specified, all numerical and percentage values, temperatures, times, particle sizes, etc., are presumed to be preceded by "about."

An important aspect of the invention is the inks used in production of solar contacts, advantageously applied to the silicon wafer by non contact deposition methods such as ink jet printing, spin coating, dip coating, and spraying.

The glass frits used to form the glass portion are not critical; a variety of lead containing and lead-free glasses may be utilized in the ink compositions of the present invention. Also, the silver-based inks of the present invention may be fired in air, no special atmosphere is required. However, the silicide forming inks are fired in low oxygen atmospheres, typically containing less than about $10^{-3}$ atmosphere oxygen partial pressure. However, other atmospheres can be used including nitrogen or other inert atmospheres, a reducing atmosphere or under conditions of substantial vacuum.

Improvement in solar cell efficiency requires reduction in resistive losses. To increase cell efficiency, the following approaches are taken: (1) Achieve low contact resistance between the fired front-contact ink and the Si wafer. (2) Use high sheet resistivity wafers. (3) Print narrow lines to reduce shadow losses so that more front area is exposed to light. (4) Increase the number of lines per unit length using narrow lines without unduly increasing the overall shadow losses. (5) Use conductors with low bulk resistivity and increased cross-sectional area, thereby fashioning narrow fingers with increased height. A conventional method of front contact deposition is screen printing, which is capable of printing lines having a width of about 120 microns, and a fired thickness of about 8 to about 20 microns.

The invention includes steps to improve cell efficiency by making a multi-layered structure. Methods of making high sheet resistivity emitter cells with low sheet resistivity tracks for making the front contacts, methods of forming a low contact resistance contact with these low sheet resistivity tracks, and methods of depositing high aspect ratio lines in these tracks are all disclosed herein.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

Figure 1A:
FIGS. 1A-1F provide a process flow diagram schematically illustrating the fabrication of a semiconductor device, and reference numerals used therein are explained below.
10: p-type silicon substrate
20: n-type diffusion layer
30: passivation layer/anti-reflective coating, which can be one of a silicon nitride film, titanium oxide film, or silicon oxide film
40: p+ layer (back surface field, BSF)
60: aluminum-based paste formed on backside
61: aluminum-based back electrode, obtained by firing backside aluminum-based paste
70: silver or silver/aluminum paste formed on backside
71: silver or silver/aluminum back electrode, obtained by firing back side silver paste
500: silver paste formed on front side according to the invention
501: silver front electrode according to the invention, formed by firing front side silver paste
510: first contact layer
520: second contact layer
530: bulk layer

The inventive method of ink jet printing conductive inks onto a silicon wafer provides the basis for low shadow losses on front contacts owing to the precise line width control possible with ink-jet printing. Conventional screen printing often results in minimum line widths of ca. 100-120 microns. Conversely, with ink jet printing technology, line widths on the order of 10-60 microns (i.e., the diameter of a single ink-jet) typically can be achieved. Such a narrow diameter ink jet openings require average particle sizes (both glass frit and silver metal) of less than about 3 microns to avoid clogging the jets.

The silver- and glass-containing inks herein may be used to make front contacts for silicon-based solar cells to collect current generated by exposure to light, or to make back contacts to conduct electrons to an outside load. Cell electrical performance as measured by cell efficiency ($\eta$) and fill factor (FF) is strongly affected by the microstructure and the electrical properties of the silver/silicon interface. The electrical properties of the solar cell are also characterized by series resistance ($R_S$) and shunt resistance ($R_{Sh}$). The composition and microstructure of the front contact interface largely determine $R_S$. The ink(s) in the contact layer herein are advantageously applied by ink jet printing. Solar cells with ink-jet printed front contacts are fired to relatively low temperatures (550° C. to 850° C. wafer temperature; firing furnace set temperatures of 650° C. to 1000° C.) to form a low resistance contact between the N-side of a phosphorus doped silicon wafer and a silver-based ink. The front contact inks, before firing, contain include a metal portion comprising silver metal in one or more physical and chemical forms (powder, flake, colloid, oxide, salt, alloy, metal organics). The inks typically also include a glass component, a vehicle, and/or other additives.

The sequence and rates of reactions occurring as a function of temperature are factors in forming the low resistance contact between the silver ink and silicon wafer. The interface structure consists of multiple phases: substrate silicon, Ag/Si islands, Ag precipitates within the insulating glass layer, and bulk silver. The glass forms a nearly continuous layer between the silicon interface and the bulk silver.

In particular, the present invention provides a method of making a solar cell contact including a contact layer and a bulk layer, the method comprising: (a) ink jet printing, onto a silicon wafer, at least a portion of which bears an antireflective coating, an ink having a solids loading of about 20 wt % to about 80 wt %, the ink comprising (i) glass frit, having (1) an average particle size of less than about 3 microns and (2) a glass transition temperature of about 200° C. to about 700° C., and (b) firing the wafer, wherein the glass frit fuses to form a glass and to form a contact layer to silicon.

Another embodiment of the invention is a method of forming a solar cell contact, comprising ink-jet printing, onto a silicon wafer bearing a partially etched antireflective coating, to form a first layer, an ink comprising: silver and a glass frit comprising oxides of at least one metal selected from the group consisting of Si, Pb, Bi, Al, Zn, B, Zr, Ti, Ta, P, alkali metals and alkaline earth metals, the glass frit having an average particle size of less than about 3 microns, and firing the wafer.

A third embodiment of the invention is a method of forming a solar cell contact comprising ink-jet printing, onto a silicon wafer, a first layer comprising a phosphorus composition; ink jet printing a conductive ink onto at least a portion of the first layer; and firing the silicon wafer in air at a temperature less than about 970° C.

A fourth embodiment is a method of making a solar cell contact comprising: ink jet printing, on at least a portion of a silicon wafer, a first phosphorus layer comprising a plating solution comprising a phosphorus-compound and a solvent, evaporating the solvent from the plating solution, ink jet printing onto at least a portion of the first phosphorus layer, an ink comprising silver and glass frit, and firing the silicon wafer to fuse the frit.

A fifth embodiment of the invention is a method of making a solar cell contact comprising: ink-jet printing, onto at least a portion of a silicon wafer, a plating solution comprising phosphorus and a solvent, evaporating the solvent, ink jet printing, onto at least a portion of the phosphorus layer, a transition metal other than silver, firing the wafer to form a silicide, applying a silver-containing composition to the silicide, and firing the silver-containing composition to form a conductive path.

A sixth embodiment of the invention is a method of making a printed electronics circuit including a contact layer and a bulk layer, the method comprising: ink jet printing, onto a substrate, an ink layer having a solids loading of about 20 wt % to about 80 wt %, the ink comprising, glass frit, having an average particle size of less than about 3 microns and a glass transition temperature of about 200° C. to about 700° C., and firing the substrate, wherein the glass frit fuses to form a glass and to form a contact layer to the substrate.

Ink Jet Printing. Ink jet printing is capable of providing extremely precise control of ink deposition owing to small jet nozzle diameters (ca. 10-60 microns), and hence the small particulates (glass frit and metal) required to freely flow from such nozzles. The term "ink jet printing" herein refers to non-contact pattern deposition methods for liquid as well as hot melt inks, irrespective of the mechanics of drop formation and spraying or jetting onto the substrate. These methods are variously referred to as aerosol jet printing, micro pen writing, micro spraying, micro air brushing etc. Further, owing to high solids loadings of the inks herein, conductive continuous traces (i.e., contact and bulk layers) can be built up quickly—more quickly, for example, than conventional inks having low solids loadings on the order of ca. 1-10 wt %; sufficient thickness of the trace can be built with minimum number passes which leads to good registration and line resolution. For use in the methods of the invention, each of the major ingredient types constituting the inks—metals, glass, and organics—is detailed hereinbelow.

Silver Component. The source of the silver can be, for example, one or more fine powders of silver metal, alloys of silver, organometallic silver compounds or a plating solution including silver. A portion of the silver can be added as silver oxide ($Ag_2O$) or as silver salts such as AgCl, $AgNO_3$, $Ag_2SO_4$, or $AgOOCCH_3$ (silver acetate). Additionally, the silver may be coated with various materials such as phosphorus. Alternately, the silver oxide can be dissolved in the glass during the glass melting/manufacturing process. The silver particles used in the ink may be spherical, flaked, or provided in a colloidal suspension, and combinations of any form of silver noted in this paragraph may be used. Suitable commercial examples of silver particles are spherical silver powder Ag3000-1, S7000-24, S7000-35, silver flakes SFCGED and SF-23, and colloidal silver suspension RDAGCOLB, all commercially available from Ferro Corporation, Cleveland, Ohio; Ag 572, Ag 574 silver powders from Powder Technology Inc., Woonsocket, R.I. Silver particles should have a median particle size of less than about 3 microns for use in ink-jet printing. Most advantageously, silver metal particles are used.

Transition Metal Component—Silicide formation. Instead of silver as the conductive metal, other transition metals may be used to form transition metal silicides with the silicon wafer. Such transition metal silicides form conductive pathways as an alternative to silver islands. Transition metals such as Ni, Fe, Co, Pt, Pd, W, Mo, Gd, Y, Zr, Hf, Ti, La, Ta, Nb, V, Ir, Rh, and combinations thereof are suitable for the formation of a conductive silicide. These silicides have either low Schottky barrier potential with N—Si and/or resistivities less than about 100 microohm-cm. The transition metals may be applied in the form of particulates or plating solutions. Owing to the likelihood of oxidation while firing to form silicides, the use of a low-oxygen firing atmosphere is advantageous. Such firing conditions typically include oxygen at a partial pressure of less than about $10^{-3}$ atmosphere, or vacuum, or reducing or inert or nitrogen atmospheres, and firing set temperatures of about 500° C. to about 1000° C., preferably about 650° C. to about 1000° C.

Etchants. The inks herein may be formulated primarily or solely for the purpose of etching an antireflective coating (ARC). While sintering of a glass frit may have the effect of etching or removing at least a portion of an ARC, in some embodiments, the inks herein advantageously include a constituent whose sole purpose is to etch or remove an ARC. In such case, the ink will include glass frit and an etchant, as well as organic components noted elsewhere herein. Typical etchants include those disclosed in Klein et al., WO2005/050673, and Klein et al., U.S. 2004/0242019, the disclosures of which are incorporated herein by reference. For example, hydrofluoric and nitric acids can be used for etching, although their use is not preferred owing to complexities of masking portions of the contact. Ammonium fluorides such as $NH_4HF_2$ or $NH_4F$ can be used. Phosphoric acids and salts thereof are also known to provide commercially acceptable removal rates. For example, orthophosphoric, metaphosphoric, pyrophosphoric acids, and salts thereof, including the ammonium salts $(NH_4)_2HPO_4$; $NH_4H_2PO_4$; $(NH_4)_3PO_4$ and compounds which form the foregoing upon thermal decomposition can remove 70 nm thick silicon nitride layers in several seconds to several minutes above 250° C. At 300° C., the time required is about 60 seconds. Owing to environmental concerns, etchants preferably do not include hydrofluoric acid or fluoride salts.

Commercial etchants include several available from Merck, KGaA, Darmstadt, Germany, sold under the trademarks SolarEtch™, Isishape™, and HiperEtch™, the formulations of which are proprietary. Certain of the Merck etchants are intended to etch $SiN_X$, $SiO_2$, silicon metal, and/or indium tin oxide (ITO). Fluoride-free etchants are also available.

Ink Glass Frits. The glass frits used herein are not critical. As an initial matter, the glass frits used in the inks herein may intentionally contain lead and/or cadmium, or they may be devoid of intentionally added lead and/or cadmium. Generally, the glasses useful herein include a Pb—Si glass, Pb—B glass, a Pb—B—Si glass, Pb—Bi—Si glass, a Pb—Al—Si glass, and a phosphate glass or lead free glasses such as lead-free Bi—Si glass; lead-free alkali-Si glass; lead free Zn—Si glass; lead free Zn—B glass; lead free alkaline earth-Si glass; and lead free Zn—B—Si glass. Combinations of the foregoing are also possible. The following tables (1-6) set forth glass frit compositions useful in the practice of the invention. An entry such as "5-55 mol % $Li_2O+Na_2O+K_2O+Rb_2O_3$" means that $Li_2O$, $Na_2O$, $K_2O$, $Rb_2O_3$, combination, is present in the specified amount.

The glass frit generally may take a form selected from the group consisting of powder, liquid glass, a physical mixture of oxide components, and combinations thereof.

In particular, the glass frit may take the form of nanopowders having an average particle size of less than about 1000, nanometers, preferably less than about 100 nanometers, more preferably less than about 50 nanometers, and still more preferably less than about 30 nanometers.

TABLE 1

Bismuth and zinc frit ingredients for layered contact glasses in mole percent of total glass

| | Glass Composition | | |
|---|---|---|---|
| Ingredient | I | II | III |
| $Bi_2O_3$ | 5-85 | 15-80 | 50-80 |
| $SiO_2$ | 1-70 | 2-45 | 15-35 |
| ZnO | 0-55 | 0.1-25 | 1-15 |
| $V_2O_5$ | 0-30 | 0.1-25 | 1-15 |

TABLE 2

Bismuth frit ingredients for layered contact glasses in mole percent of total glass

| | Glass Composition | | |
|---|---|---|---|
| Ingredient | IV | V | VI |
| $Bi_2O_3$ | 5-65 | 5-55 | 10-40 |
| $SiO_2$ | 15-70 | 20-70 | 30-65 |
| $B_2O_3$ | 0-35 | 0.1-35 | 3-20 |
| Alkali oxides | 0-35 | 0.1-25 | 5-25 |

TABLE 3

Lead frit ingredients for front contacts in mole percent of total glass

| | Glass Composition | | |
|---|---|---|---|
| Ingredient | VII | VIII | IX |
| PbO | 15-75 | 25-66 | 30-64 |
| SiO$_2$ | 5-50 | 15-40 | 20-35 |
| ZnO | 0-50 | 5-35 | 20-33 |
| PbO + ZnO | 15-80 | 20-70 | 25-65 |

TABLE 4

Oxide frit ingredients for alkali-titanium-silicate back contact glasses in mole percent of total glass.

| | Glass Composition | | |
|---|---|---|---|
| Ingredient | IV | V | VI |
| Li$_2$O + Na$_2$O + K$_2$O + Rb$_2$O$_3$ | 5-55 | 15-50 | 30-40 |
| TiO$_2$ | 2-26 | 10-26 | 15-22 |
| B$_2$O$_3$ + SiO$_2$ | 5-75 | 25-70 | 30-52 |
| V$_2$O$_5$ + Sb$_2$O$_5$ + P$_2$O$_5$ | 0-30 | 0.25-25 | 5-25 |
| MgO + CaO + BaO + SrO | 0-20 | 0-15 | 0.1-10 |
| F | 0-20 | 0-15 | 5-13 |

TABLE 5

Zinc frit ingredients for layered contact glasses in mole percent of total glass

| | Glass Composition | | |
|---|---|---|---|
| Ingredient | IV | V | VI |
| ZnO | 5-65 | 7-50 | 10-32 |
| SiO$_2$ | 10-65 | 20-60 | 22-58 |
| B$_2$O$_3$ | 5-55 | 7-35 | 10-25 |

A given embodiment need not contain all frit ingredients as noted in the tables above; various combinations are possible. Indeed, ranges of oxides may be chosen from different columns within a table to constitute an "embodiment." Further embodiments of contact glasses are represented in Table 6. In any table herein, for each oxide range having a lower bound of zero, an alternate embodiment is the range having a lower bound of 0.1 mol %.

Inorganic/Other Additives. Phosphorus can be added to the ink in a variety of ways, in a variety of phosphorus compositions, to reduce the resistance of the front contacts. For example, certain glasses can be modified with P$_2$O$_5$ in the form of a powdered or fritted oxide, or phosphorus can be added to the ink by way of phosphate esters and other organophosphorus compounds. In certain embodiments, the phosphorus composition comprises at least about 10 wt % elemental phosphorus, dry basis. In others, the phosphorus composition comprises a phosphorus glass comprising at least about 25 mole % P$_2$O$_5$. Inorganic phosphorus compounds useful herein include H$_3$PO$_4$, phosphate salts, phosphate glass, phosphine, P$_2$O$_5$, and combinations thereof.

In other embodiments, the phosphorus composition comprises an organophosphorus compound selected from the group consisting of: [R$^1$—O]$_3$—P; [Ar$^1$—O]$_3$—P; [R$^2$—Ar$^2$—O]$_3$—P; [R$^3$—Ar$^3$—O]$_3$—P; P—[(R$^4$—O)$_x$(Ar$^4$—O)$_y$(R$^5$—Ar$^5$—O)$_{3-(x+y)}$]; [(R$^6$O$_2$—P—Ar$^6$]$_2$; [(Ar$^7$O)$_2$—P—Ar$^7$]$_2$; and [(R$^7$O)$_2$—P—R$^8$]$_2$, wherein R$^1$ to R$^8$ are each independently selected from the group consisting of C$_1$-C$_{10}$ alkyl and substituted alkyl groups, and Ar$^1$ to Ar$^{10}$ are each independently selected from the group consisting of phenyl and substituted phenyl groups.

More simply, phosphorus can be added as a coating to silver particles prior to making an ink. In such case, prior to making inks, the silver particles are mixed with liquid phosphorus and a solvent. For example, a blend of about 85 to about 95 wt % silver particles, about 5 to about 15 wt % solvent and about 0.5 to about 10 wt % liquid phosphorus is mixed and the solvent evaporated. Phosphorus coated silver particles help ensure intimate mixing of phosphorus and silver in the inventive inks.

Other additives such as fine silicon or carbon powder, or both, can be added to the ink to control the silver reduction and precipitation reaction. The silver precipitation at the interface or in the bulk glass, can also be controlled by adjusting the firing atmosphere (e.g., firing in flowing N$_2$ or N$_2$/H$_2$/H$_2$O mixtures). However, no special atmosphere is required to fire a silver-based contact. As noted hereinabove, inks containing transition metals to faun silicides require firing in low oxygen atmosphere (pO$_2$<10$^{-3}$ atmospheres). Fine low melting metal additives (i.e., elemental metallic additives as distinct from metal oxides) such as Pb, Bi, In, Ga, Sn, and Zn and alloys of each with at least one other metal can be added to provide a contact at a lower firing temperature, or to widen the firing window.

TABLE 6

Further embodiments of glass compositions mole percent of the glass component.

| Glass ID | XIII | XIV | XV | XVI | XVII | XVIII | XIX | XX | XXI | XXII | XXIII |
|---|---|---|---|---|---|---|---|---|---|---|---|
| Oxide | | | | | | | | | | | |
| PbO | 58-64 | 25-40 | 58-64 | 26-34 | 58-66 | 58-66 | 58-70 | 58-66 | 58-64 | 58-66 | |
| SiO$_2$ | 25-31 | 20-31 | 22-32 | 27-33 | 20-31 | 20-31 | 20-31 | 20-32 | 30-45 | 20-32 | 35-50 |
| ZnO | 0-10 | 5-34 | | 27-33 | | | | | | | 5-15 |
| Al$_2$O$_3$ | 2-11 | 4-10 | | 5-11 | 1-9 | 1-9 | 1-11 | 1-9 | 1-9 | | |
| Ta$_2$O$_5$ | | 0-2 | | 0.1-2 | 0.1-2 | | | 0.1-4 | | | |
| P$_2$O$_5$ | | | | | | | | 0.1-4 | | | |
| HfO$_2$ + In$_2$O$_3$ + Ga$_2$O$_3$ | | | 0.1-8 | | | | | | | | |
| ZrO$_2$ | | | | | 0.1-5 | | 0.1-2 | 0.1-4 | 0.1-4 | 0.1-5 | 5-15 |
| B$_2$O$_3$ | | | | | | 0-3 | | | 20-30 | 5-10 | 5-15 |
| Sb$_2$O$_5$ | | | | | | 0.1-3 | | | | | |
| TiO$_2$ | | | | | | | | 10-20 | | | |
| Bi$_2$O$_3$ | | | | | | | | | | | 15-25 |
| Nb$_2$O$_5$ | | | | | | | | | | | 0.1-2 |
| Alkali Glasses | | | | | | | | | | | 1-15 |

A mixture of (a) glasses or a mixture of (b) glasses and crystalline additives or a mixture of (c) one or more crystalline additives can be used to formulate a glass component in the desired compositional range. The goal is to reduce the contact resistance and improve the solar cell electrical performance. For example, second-phase crystalline materials such as $Bi_2O_3$, $Sb_2O_3$, $Sb_2O_5$, $In_2O_3$, $Ga_2O_3$, SnO, ZnO, $Pb_3O_4$, PbO, $SiO_2$, $ZrO_2$, $Al_2O_3$, $B_2O_3$, and $Ta_2O_5$ may be added to the glass component to adjust contact properties. Combinations and reaction products of the aforementioned oxides can also be suitable to design a glass component with desired characteristics. For example, low melting lead silicates, either crystalline or glassy, formed by the reaction of PbO and $SiO_2$ such as $4PbO.SiO_2$, $3PbO.SiO_2$, $2PbO.SiO_2$, $3PbO.2SiO_2$, and $PbO.SiO_2$, either singly or in mixtures can be used to formulate a glass component. A second phase of lead silicates may optionally be used. Other reaction products of the aforementioned oxides such as $ZnO.SiO_2$ and $ZrO_2.SiO_2$ may also be used. However, the total amounts of the above oxides must fall within the ranges specified for various embodiments disclosed elsewhere herein.

Certain glasses containing oxides of hafnium ($HfO_2$), indium ($In_2O_3$), and/or gallium ($Ga_2O_3$) have been found to increase both the size and quantity of the conductive Ag/Si islands. Hence, about 0.1 to about 15 mol % $HfO_2+In_2O_3+Ga_2O_3$ may be included in the glass component.

Oxides of tantalum and molybdenum reduce glass viscosity and surface tension of the glass during firing, facilitating better wetting of the wafer by the molten glass. Accordingly, up to about 10 mol % $Ta_2O_5$, and up to about 3 mol % $MoO_3$ can be included in the glass component. Preferably, the included ranges of $Ta_2O_5$ and $MoO_3$ have a lower bound of 0.1 mol %.

Kinetics of silver dissolution and precipitation from the glass compositions can be altered by the presence of alkali metal oxides. In that regard, the compositions of the present invention may further comprise oxides of alkali metals, for example $Na_2O$, $K_2O$, $Li_2O$, and $Rb_2O$ and combinations thereof. In particular, the glass components of certain embodiments herein may contain from about 0.1 to about 15 mol % $Na_2O+K_2O+Li_2O+Rb_2O$, or from about 0.1 to about 5 mol % $Na_2O+K_2O+Li_2O+Rb_2O$.

The glass in the front contact ink plays many roles in forming an efficient front contact silver-silicon interface. The front contact ink glass corrodes the antireflective coating, typically made of silicon nitride ($SiN_x$) or titanium dioxide ($TiO_2$) to form fired through contacts to underlying Si. The glass also takes part in a self-limiting interaction with Ni and Si to oxidize and dissolve a portion of Si into the glass as $SiO_2$. Because the local concentration of $SiO_2$ increases the viscosity of the glass, this increase will eventually limit further dissolution of Si as $SiO_2$, giving rise to a self-limiting interaction of the glass with Si to preserve the PN junction. The glass also dissolves Ag metal into the glass, transports Ag ions to the silicon interface, and precipitates Ag from the glass to form beneficial Ag/Si islands at the interface. Finally, the glass serves to enhance densification of the silver ink to reduce bulk silver resistivity and enhances bonding (adhesion) between the silicon wafer and the fired silver ink.

Organic Vehicle and other Organic Components. The organic vehicle for most conductive compositions is typically a solution of a resin dissolved in a solvent and, frequently, a solvent solution containing both resin and a thixotropic agent. The solvent usually boils from about 130° C. to about 350° C. The most frequently used resin for this purpose is ethyl cellulose. However, resins such as ethyl hydroxyethyl cellulose, wood rosin, mixtures of ethyl cellulose and phenolic resins, hydrocarbon resins, polymethacrylates of lower alcohols and the monobutyl ether of ethylene glycol monoacetate can also be used.

The most widely used solvents for ink applications are terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), dipropylene glycol methyl ether (DPM), diethylene glycol methyl ether (DM), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on phosphorus or silver, to modify the contact. Various combinations of these and other solvents can be formulated to obtain the desired viscosity and volatility requirements for each application.

Other Organic Components. Other dispersants, surfactants and rheology modifiers, which are commonly used in ink formulations, may be included. For example, rheology modifiers that form a "weak gel" in the range of room temperature are advantageously included in the ink to prevent settling of the glass and metal particles during product storage, shipping, etc. In a "weak gel," the molecular shape of the gelator, the solvent nature, and the thermodynamic conditions in which the gel is formed lead to a liquid-like viscoelastic behavior below the sol-gel transition temperature ($T_{GS}$). Transient networks are created. Like a "strong gel," a "weak gel" network is thermally reversible. Upon heating, the supramolecular architectures are melted and individual molecules (or separated strands of aggregated molecules) are again dispersed in the bulk solution.

Such rheology modifiers providing a "weak gel" include Thixatrol-ST, Thixatrol-SR, Thixatrol-SR100, Thixatrol-Plus from Elementis Corp; BYK-410, BYK-411 from BYK Chemie, Gelling Agents PE-400, PA-1200, PE-1800 supplied by Arizona Chemicals.

Products useful in the organic carrier may be obtained commercially under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.). N-DIFFUSOL® is a stabilized liquid preparation containing an n-type diffusant with a diffusion coefficient similar to that of elemental phosphorus. The products with the Surfynol trademark are surfactants commercially available from Air Products and Chemicals, Inc., Allentown, Pa., USA. The products with the Solsperse trademark are dispersants commercially available from Lubrizol Corporation, Cleveland, Ohio, USA. Natralith 611 is an ink additive commercially available from The Fanning Corporation, Chicago, Ill.

Surfactants sold under the Tergitol trademark are commercially available from Dow Chemical Company, Midland, Mich., USA. Styrene based resins sold under the Piccolastic trademark, are available from Eastman Chemical Company, Kingsport, Tenn., USA. Aromatic 100 is a hydrocarbon fluid available from ExxonMobil Chemical Company, Houston, Tex., USA.

Among commonly used organic thixotropic agents is hydrogenated castor oil and derivatives thereof. A thixotrope is not always necessary because the solvent/resin properties coupled with the shear thinning inherent in any suspension may alone be suitable in this regard. Furthermore, wetting agents may be employed such as fatty acid esters, e.g., N-tallow-1,3-diaminopropane di-oleate; N-tallow trimethylene diamine diacetate; N-coco trimethylene diamine, beta diamines; N-oleyl trimethylene diamine; N-tallow trimethylene diamine; and N-tallow trimethylene diamine dioleate, and combinations thereof.

It should be kept in mind that the foregoing compositional ranges are preferred and it is not the intention to be limited to these ranges where one of ordinary skill in the art would recognize that these ranges may vary depending upon specific applications, specific components and conditions for processing and forming the end products.

Ink Preparation. The ink according to the present invention may be conveniently prepared on a three-roll mill and diluted with a suitable solvent or a mixture of solvents and additives. The ink can also be prepared by suitable dispersion equipment such as bead mill, ball mill, ultrasonic mixing equipment. The amount and type of carrier utilized are determined mainly by the final desired formulation viscosity for a given ink jet printer. In preparing compositions according to the present invention, the particulate inorganic solids are mixed with the carrier and dispersed with suitable equipment to form a suspension, resulting in a composition for which the viscosity will be in the range of about 5 to about 500 cps, preferably about 10 to about 200 cps, at a shear rate of 200 $sec^{-1}$ as determined on a Carri-Med viscometer at 25° C. The solids content of the inks is generally in the range of about 20 wt % to about 80 wt %, preferably about 40 wt % to about 60 wt % for equipment such as the Dimatix ink jet printer, more preferably about 60 wt % to about 75 wt % for aerosol material deposition equipment such as Optomec ink jet printers. The solids included in the "solids content" are glass frit, metal particles, and inorganic additives as noted herein. The surface tension of the inks will be about 20 to about 60 dyne-cm, preferably about 30 to about 50 dyne-cm.

Printing and Firing of the Ink(s). The aforementioned ink compositions may be used in a process to make a solar cell contact or other solar cell components. The inventive method of making solar cell contacts comprises (1) ink-jet printing at least a first silver- and glass-containing ink to a silicon substrate to form a contact layer, and (2) firing the ink, which sinters the metal and fuses the glass to make contact to silicon. The printed pattern of the ink is fired at a suitable temperature, such as about 650 to about 1000° C. furnace set temperature, or about 550 to about 850° C. wafer temperature. Preferably, the furnace set temperature is about 750 to about 930° C., and the ink is fired in air. The antireflective layer ($SiN_x$, or $SiO_2$ or $TiO_2$) is believed to be oxidized and corroded by the glass during firing and Ag/Si islands are formed on reaction with the Si substrate. The islands are epitaxially bonded to silicon. Firing conditions are chosen to produce a sufficient density of Ag/Si islands on the silicon wafer at the silicon/silver interface, leading to a low resistivity, contact thereby producing a high efficiency, high-fill factor solar cell, after depositing the bulk layer.

A typical ARC is made of a silicon compound such as silicon nitride, generically $SiN_x$, such as $Si_3N_4$, or $SiO_2$. Titanium dioxide ($TiO_2$) is also useful as an ARC. This layer acts as an insulator, which tends to increase the contact resistance. Corrosion of the ARC by the glass component is hence a necessary step in front contact formation. The inventors herein have discovered that reducing the resistance between the silicon wafer and the ink or paste is facilitated by the formation of epitaxial silver/silicon conductive islands at the interface. That is, the silver islands on silicon assume the same crystalline structure as is found in the silicon substrate. When such an epitaxial silver/silicon interface does not result, the resistance at that interface becomes unacceptably high. Until now, the processing conditions to achieve a low resistance epitaxial silver/silicon interface have been very narrow and difficult to achieve. The inks and processes herein now make it possible to produce an epitaxial silver/silicon interface leading to a contact having low resistance under broad processing conditions—a minimum firing temperature as low as about 650° C., but which can be fired up to about 850° C. (wafer temperature). The silver-based inks herein can be fired in air.

Method of Front Contact Production. A solar cell contact according to the present invention may be produced by applying any conductive ink disclosed herein to a substrate, for example by ink jet printing, to a desired wet thickness, e.g., from about 40 to about 80 microns., to form a contact layer.

Figure 2:
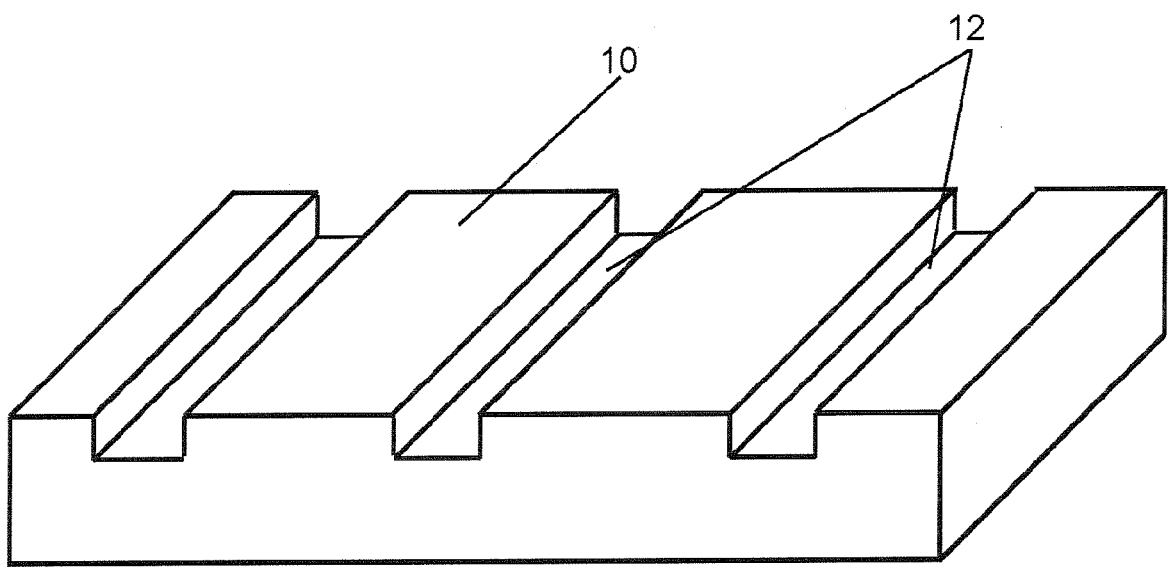
FIG. 2 shows an embodiment of silicon substrate 10 having at least one groove formed therein.

In particular, FIG. 1A schematically shows a step in which a substrate of single-crystal silicon or multicrystalline silicon is provided, typically with a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 microns of the substrate surface using an aqueous alkali solution such as KOH or NaOH, or using a mixture of HF and $HNO_3$. The substrate optionally may be washed with a mixture of HCl and $H_2O_2$ to remove heavy metals such as iron that may adhere to the substrate surface. An antireflective textured surface is sometimes formed thereafter using, for example, an aqueous alkali solution such as aqueous potassium hydroxide or aqueous sodium hydroxide. This gives the substrate, 10, depicted with exaggerated thickness dimensions, as a typical silicon wafer is ca. 200 microns thick. FIG. 2 shows an alternate embodiment of silicon substrate 10 having at least one groove 12 formed therein.

Figure 1B:
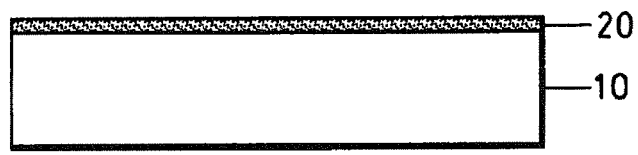

Referring to FIG. 1B, which schematically shows that, when a p-type substrate is used, an n-type layer 20 is formed to create a p-n junction. A phosphorus diffusion layer is supplied in any of a variety of suitable forms, including, for example, phosphorus oxychloride ($POCl_3$), organophosphorus compounds, and others disclosed herein. The phosphorus source may be selectively applied to only one side of the silicon wafer. The depth of the diffusion layer can be varied by controlling the diffusion temperature and time, is generally about 0.3 to 0.5 microns, and has a sheet resistivity of about 40 to about 100 ohms per square. The phosphorus source may include a phosphorus-containing liquid coating material such as phosphosilicate glass (PSG), applied to only one surface of the substrate by a procedure such as spin coating, where diffusion is effected by annealing under suitable conditions.

Figure 1C:
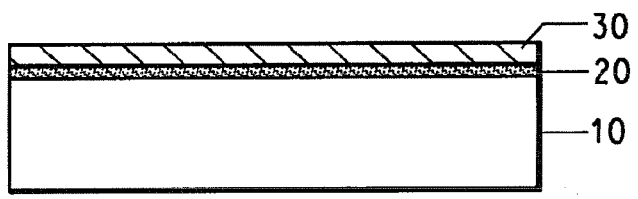

Next, in FIG. 1C, an antireflective coating (ARC) 30, made of $SiN_x$, $TiO_2$ or $SiO_2$, is formed on the above-described n-type diffusion layer, 20. The ARC 30 usually serves as a passivating film. Silicon nitride is sometimes expressed as $SiN_x$:H to emphasize passivation by hydrogen. The ARC 30 reduces the surface reflectance of the solar cell to incident light, thus increasing the amount of light absorption, and thereby increasing the electrical current generated. The thickness of passivating layer 30 depends on the refractive index of the material applied, although a thickness of about 700 to 900 Å is suitable for a refractive index of about 1.9 to 2.0. The passivating layer may be formed by a variety of procedures including low-pressure CVD, plasma CVD, or thermal CVD. When thermal CVD is used to form a $SiN_x$ coating, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a substantially stoichiometric compositional ratio between the silicon and the nitrogen—$Si_3N_4$. Other methods of forming a passivating layer are known in the art.

Figure 1D:
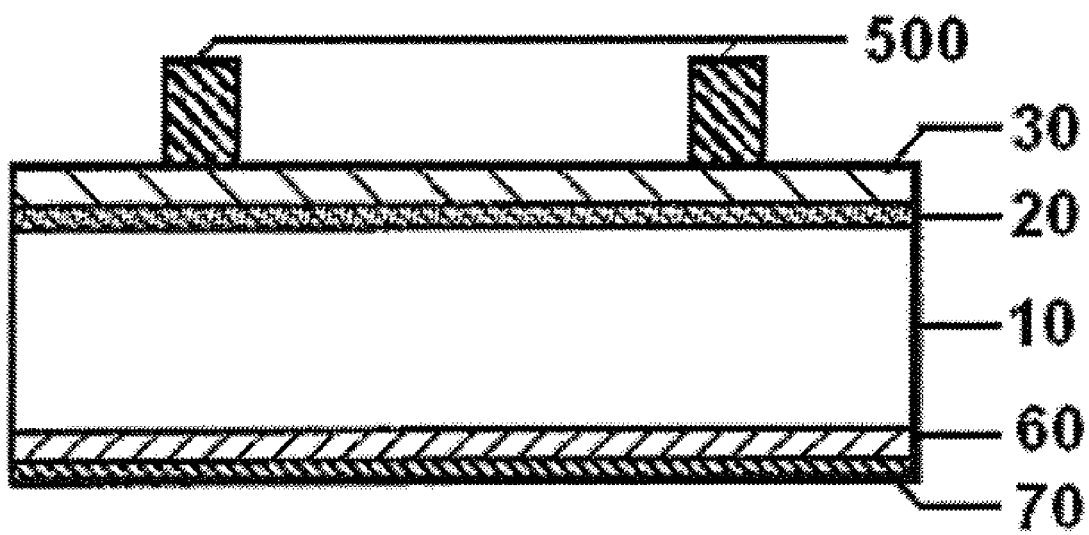

As shown in FIG. 1D, an aluminum paste or ink 60 and a backside silver or aluminum paste or ink 70 are then selectively screen printed and successively dried on the backside of the substrate. The aluminum paste or ink may include one or more glass frits from Tables 1-5. A silver ink 500 for the front electrode is next screen printed and dried over the ARC 30; the silver ink 500 may similarly include one or more glass frits from Tables 1-5. For subsequent ("bulk") layers, other techniques, such as automatic screen-printing, can be employed for example, using a 200-325 mesh screen. While ink jet printed inks typically do not require drying, any screen-printed layers are then dried at 200° C. or less, preferably about 125 to about 175° C. for about 5-15 minutes before firing. Firing is then carried out in an infrared belt furnace, at a temperature set within the range of about 650° C. to about 1000° C., such as 700° C., 750° C., 800° C., 850° C., 900° C., 950° C. and other values in between, for a period of from about one second to several minutes, for example, 3, 5, 7, 9, or more minutes. During firing, the glass is fused and the metal (in bulk and other layers where it is present) is sintered. The phrase "furnace set temperature" and similar terminology means that the heating device, oven, kiln, or furnace used to fire the workpieces (wafers and other substrates) herein is set at the indicated temperature and has achieved such "set temperature" prior to introducing the workpiece for firing. All firing temperatures disclosed and claimed herein refer to "set temperatures" and "wafer temperatures" and similar terminology indicate the temperature to which a workpiece is heated. A "wafer temperature" is not necessarily the same as the "set temperature" for a given firing operation.

Nitrogen ($N_2$) or another inert atmosphere may be used if desired, however no special atmosphere is required to make a silver-based contact. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute, preferably 3 meters/minute (about 120 inches/minute). In a preferred example, zone 1 is about 7 inches (18 cm) long, zone 2 is about 16 inches (40 cm) long, and zone 3 is about 7 inches (18 cm) long. The temperature in each successive zone is typically, though not always, higher than the previous, for example, 700-790° C. in zone 1, 800-850° C. in zone 2, and 800-970° C. in zone 3. Naturally, firing arrangements having more than 3 zones are envisioned by the present invention, including 4, 5, 6, or 7, zones or more, each with zone lengths of about 5 to about 20 inches and firing temperatures of 650 to 1000° C.

Figure 1E:
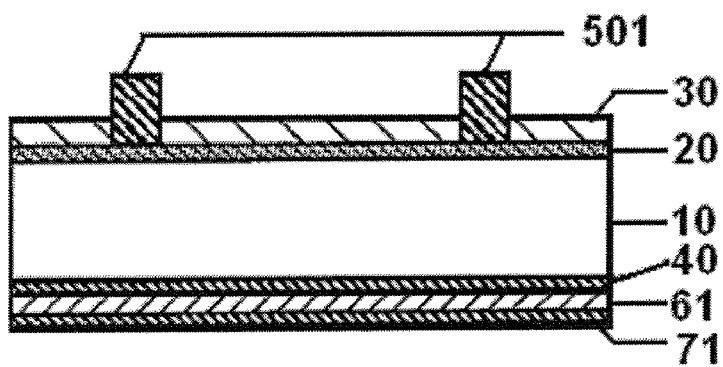

Consequently, as schematically shown in FIG. 1E, silver ink 500 and aluminum from the aluminum paste or ink 60 each melts and reacts with the silicon substrate 10 during firing. Backside paste or ink 60 then solidifies to form a p+ layer, 40, containing a high concentration of aluminum dopant. This layer is generally called the back surface field (BSF) layer, and helps to improve the energy conversion efficiency of the solar cell.

Figure 1F:
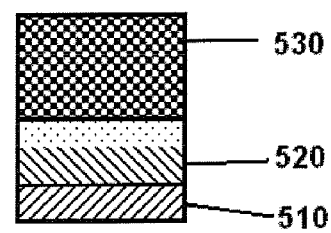

The backside aluminum paste is transformed by firing from a dried state 60 to an aluminum back contact 61. The backside silver or aluminum paste 70 is fired at the same time, becoming a silver or aluminum back contact 71. During firing, the boundary between the backside Al and the backside silver or aluminum assumes an alloy state, and is also connected electrically. The back contact is covered with the Al paste or ink, to a wet thickness of about 30 to 50 microns, owing in part to the need to form a thicker p+ layer 40. The back side silver paste areas are used for tab attachment during module fabrication. In addition, the front electrode-forming silver paste 500 sinters and penetrates through (i.e., fires through) the silicon nitride film 30 during firing, and is thereby able to electrically contact the n-type layer 20, as shown by front electrodes 501 in FIG. 1E. In particular, as shown in FIG. 1F, silver ink 500, and, accordingly, front electrode 501 each includes at least one contact layer 510 and at least one bulk layer, 530, which may be subsequently printed over any contact layers. FIG. 1F is a schematic close-up of silver ink 500 which becomes fired electrode 501 from FIGS. 1D and 1E, respectively. Layer 520 represents an optional second contact layer. As shown in FIG. 1F, multiple deposited layers 510, 520, can form part of a contact layer.

A solar cell back contact according to the present invention can be produced by applying any Ag or Al paste disclosed herein, produced by mixing aluminum powders, with the glass compositions of Tables 1-6, to the P-side of the silicon substrate pre-coated with silver rear contact paste, for example by screen printing, to a desired wet thickness, e.g., from about 30 to 50 microns. To make a front contact, front contact silver pastes are printed on the front side.

In particular, the invention provides a method of making a solar cell contact including a contact layer and a bulk layer, the method comprising: (a) ink jet printing, onto a silicon wafer, at least a portion of which bears an antireflective coating, an ink having a solids loading of about 20 wt % to about 70 wt %, the ink comprising (i) glass frit, having (1) an average particle size of less than about 3 microns and (2) a glass transition temperature of about 200° C. to about 700° C., and (b) firing the wafer, wherein the glass frit fuses to form a glass and forms a contact layer to silicon. Additionally, after step (b) firing the wafer, a bulk layer may be formed, by applying to the contact layer a second ink layer comprising metal. The second ink may further comprise a glass frit. The wafer, now bearing the fired contact layer and one or more wet (metal-containing) bulk layers, is fired a second time (or more) to make a sintered bulk layer. The bulk layer may be deposited using a plating method or a direct writing method. The bulk and contact layers may be co-fired. Further, after firing the wafer to form the contact layer, and prior to forming the bulk layer, at least a portion of the glass may be removed.

Instead of metal, the bulk layer(s) may be formed by an ink comprising a curable polymeric resin. In such case, the inventive method involves curing the second (or subsequent) conductive ink.

Examples

Polycrystalline silicon wafers, 15.6 cm×15.6 cm, 180-250 microns thick, were coated with a silicon nitride antireflective coating. The sheet resistivity of these wafers was about 55 Ω/square. Examples using the paste compositions of Tables 7 were printed using either a Dimatix Material Printer (DMP-2800) from Dimatix Inc., Santa Clara, Calif., USA ("Di"), or Maskless Mesoscale Deposition System (M3D) from Optomec, Inc., Albuquerque, N. Mex., USA ("Op"). The symbol "~" means "approximately." The suitable ink viscosity for Dimatix printer is ~10 to 20 cP and ~100 to 200 cP for the Optomec Systems printer at room temperature of ~25° C. The ink viscosity during the printing can be further adjusted by adjusting the ink reservoir temperature from room temperature to ~80° C. The high solids loading of 50-60 wt % for Dimatix ink jet printers and the high solids loadings of ~70-75 wt % for the Optomec Systems were achieved as shown in Table 7.

Samples were dried at about 150° C. for about 10 minutes after printing the front contacts. The samples for determining suitable contact formation were fired in a laboratory box furnace at a set temperature of about 700 to about 750° C. for 30 seconds. The printed wafers for electrical testing were co-fired in air using a 3-zone infrared (IR) belt furnace from RTC, with a belt speed of about 3 meters (120") per minute, with temperature set points of 830° C. in all three zones. The zones were 7", 16", and 7" long, respectively. The fired finger width for most samples was about 120 to about 170 microns, and the fired thickness was about 10 to 15 microns. The bulk layer of the contact was formed by plating silver thereon.

Electrical performance of the solar cells was measured with a solar tester under AM 1.5 sun conditions, in accordance with ASTM G-173-03. The results of this electrical testing for the examples of Table 7 are shown in Table 9. Glass compositions A-D are shown in Table 8. Viscosity is measured at a shear rate of 200 (1/sec). Jsc means short circuit current density, measured at zero output voltage; Voc means open circuit voltage measured at zero output current. The solar cell properties were also compared to the screen printed commercial solar ink CN33-462 from Ferro. Table 9 clearly shows the inkjet ink formulations of the invention and their properties represent significant improvements in solar cell performance as measured by the cell efficiency ($\eta$) and fill factor (FF).

TABLE 7

Inkjet formulations for contacts.

| | Ink Formulation ID | | | | | | | | | | | | |
|---|---|---|---|---|---|---|---|---|---|---|---|---|---|
| | 1 | 2 | 4 | 9 | 10 | 12 | 15 | 16 | 17 | 18 | 19 | 20 | 21 |
| Deposition System | Op | Op | Op | Op | Op | Op | Op | Op | Op | Op | Op | Di | Di |
| Material | | | | | | | | | | | | | |
| Ag 574 (0.55 m²/g) Supplier Technic | 67.8 | | 66.0 | | | | | | | | | | |
| Silver Powder 3000-1 Ferro | | 56.2 | | | | | | | | | | | |
| S7000-24 | | | | 68.9 | 68.9 | 66.3 | 65.1 | 61.7 | 65.2 | 65.2 | 65.2 | | |
| S7000-35 | | | | | | | | | | | | 52.9 | 51.8 |
| Colloidal Silver RDAGCOLB | | 10.2 | | | | | | | | | | | |
| Zinc Metal Powder | 2.6 | | | | | | | | | | | | |
| Glass A | 3.9 | | 3.8 | 3.9 | 3.9 | 7.5 | 5.5 | 10.5 | 7.3 | | | | |
| Glass B | | 3.7 | | | | | | | | | | 4.1 | 6.8 |
| Glass C | | | | | | | | | | 7.3 | | | |
| Glass D | | | | | | | | | | | 7.3 | | |
| Vehicle w/Ethyl Cellulose | 4.4 | 4.1 | 4.1 | 4.4 | 4.4 | 4.2 | 3.9 | 3.7 | | | | 5.0 | |
| Piccolastic ™ A5 Resin | | | | | | | | | | | | | 2.9 |
| Solsperse ™ 28000 | 0.8 | 0.7 | 0.8 | 0.8 | 0.8 | 0.8 | 0.7 | 0.7 | 0.7 | 0.7 | 0.7 | 0.5 | 1.0 |
| Surfynol ™ 61 | | | | | | | | | | | | | 2.0 |
| Triton ™ X-100 | | | | | | | | | | | | 0.1 | |
| Surfynol ™ CT-111 | | | | | | | | | | | | 3.4 | |
| Surfynol ™ 104A | | 0.7 | 0.8 | | | | | | | | | | |
| Natralith ™ 611 | | 0.8 | 0.8 | 0.4 | 0.4 | 0.4 | 0.4 | 0.4 | 0.4 | 0.4 | 0.4 | | |
| Tergitol ™ NP-4 | | | | 0.8 | 0.8 | 0.8 | 0.7 | 0.7 | 0.7 | 0.7 | 0.7 | | |
| Butyl Diglyme | | | | | | | | | | | | 34.0 | |
| Terpineol Mix | | | | | | | | | | | | | 23.0 |
| Aromatic 100 | | | | | | | | | | | | | 12.4 |
| Dowanol | 20.0 | 22.9 | 23.0 | 20.5 | | | | | | | | | |
| Dowanol DPM | | | | | 20.5 | 19.7 | 23.2 | 22.0 | 25.2 | 25.2 | 25.2 | | |
| BYK-410 | 0.5 | 0.8 | 0.8 | 0.4 | 0.4 | 0.4 | 0.4 | 0.4 | 0.4 | 0.4 | 0.4 | | 0.05 |
| Total | 100 | 100 | 100 | 100 | 100 | 100 | 100 | 100 | 100 | 100 | 100 | 100 | 100 |
| % Solids | 74.4 | 70.1 | 69.8 | 72.8 | 72.8 | 73.8 | 70.6 | 72.2 | 72.5 | 72.5 | 72.5 | 57.0 | 58.7 |
| Viscosity (cP) | 100 | 100 | 80 | 150 | 130 | 190 | 110 | 140 | 116 | | | 30 | 15 |

TABLE 8

Glass compositions used in Examples of Table 7.

| | Frit ID | | | |
|---|---|---|---|---|
| Oxide Mole % | A | B | C | D |
| $Al_2O_3$ | 5 | 8 | | 2.14 |
| $B_2O_3$ | | | 10.00 | 24.05 |
| $Bi_2O_3$ | | | 21.57 | |
| $K_2O$ | | | | 0.87 |
| $Li_2O$ | | | 10.50 | |
| $Na_2O$ | | | 2.50 | 12.03 |
| $Nb_2O_5$ | | | 1.86 | |
| $P_2O_5$ | 2.5 | | | |
| PbO | 62.6 | 31.3 | | |
| $SiO_2$ | 28.4 | 29.8 | 43.90 | 24.23 |
| $TiO_2$ | | | | 3.65 |
| $Ta_2O_5$ | 0.3 | 0.9 | | |
| ZnO | | 30 | 9.70 | 30.09 |
| $ZrO_2$ | 1.2 | | | 2.95 |

TABLE 9

Properties of the solar cells made with ink compositions of Table 7 compared to screen printed ink

| Inkjet Inks | Ink No | VOC [mV] | JSC [mA/cm²] | FF | $\eta$ [%] |
|---|---|---|---|---|---|
| | 9 | 612.0 | 34.4 | 0.729 | 15.4 |
| | 10 | 612.8 | 34.2 | 0.774 | 16.2 |
| | 12 | 612.6 | 34.1 | 0.776 | 16.2 |
| | 15 | 612.6 | 34.0 | 0.774 | 16.2 |
| | 16 | 612.7 | 34.2 | 0.772 | 16.2 |
| 33-462 Screen Print | | 601.6 | 33.4 | 0.745 | 15.0 |

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A method of making a solar cell contact including a contact layer and a bulk layer, the method comprising:
   a. ink-jet printing, onto a silicon wafer, at least a portion of which bears an antireflective coating, a first conductive ink layer having a solids loading of about 20 wt % to about 80 wt %, the ink comprising silver and phosphorus, wherein the phosphorus is present as a coating on silver, and glass frit having an average particle size of less than about 3 microns and a glass transition temperature of about 200° C. to about 700° C.,
      wherein the phosphorus composition comprises an organophosphorus compound selected from the group consisting of: $[R^1-O]_3-P$; $[Ar^1-O]_3-P$; $[R^2-Ar^2-O]_3-P$; $[R^3-Ar^3-O]_3-P$; $P-[(R^4-O)_x(Ar^4-O)_y(R^5-Ar^5-O)_{3-(x+y)}]$; $[(R^6O)_2-P-Ar^6]_2$; $[(Ar^7O)_2-P-Ar^7]_2$; and $[(R^7O)_2-P-R^8]_2$, wherein $R^1$ to $R^8$ are each independently selected from the group consisting of $C_1$-$C_{10}$ alkyl and substituted alkyl groups, and $Ar^1$ to $Ar^{10}$ are each independently selected from the group consisting of phenyl and substituted phenyl groups and
   b. firing the wafer, wherein the glass frit fuses to form a glass and forms a contact layer to silicon.

2. The method of claim 1, wherein the ink further comprises a metal selected from the group consisting of nickel, iron, cobalt, platinum, palladium, tungsten, molybdenum, gadolinium, yttrium, zirconium, hafnium, titanium, lanthanum, tantalum, niobium, vanadium, iridium, rhodium, and combinations thereof.

3. A method of forming a solar cell comprising:
   a. cleaning a silicon wafer including a first side and a second side, the second side being opposite the first side;
   b. depositing phosphorus on the silicon wafer;
   c. firing the silicon wafer to form a layer with a high phosphorus surface concentration;
   d. removing phosphorous glass formed during the firing;
   e. depositing a thin anti-reflective coating on the first side;
   f. ink-jet printing onto the first side of the silicon wafer a first layer comprising a phosphorus composition;
   g. ink-jet printing a conductive ink onto at least a portion of the first layer;
   h. ink-jet printing the conductive ink onto at least a portion of the second side;
   i. firing the silicon wafer in air at a temperature less than about 970° C., wherein the ink comprises:
      i. silver and
      ii. a glass frit comprising an oxide of a metal selected from the group consisting of silicon, lead, bismuth, aluminum, zinc, boron, zirconium, titanium, tantalum, phosphorus, alkali metals, alkaline earth metals, and combinations thereof, the glass frit having an average particle size of less than about 3 microns.

4. The method of claim 3, wherein the phosphorus composition comprises at least 10 wt % elemental phosphorus, dry basis.

5. The method of claim 3, wherein the phosphorus composition comprises a phosphorus-glass comprising at least about 25 mol % of phosphorus pentoxide.

6. A method of making a solar cell contact comprising:
   a. ink-jet printing, onto at least a portion of a silicon wafer, a first phosphorus layer comprising a plating solution comprising a phosphorus-compound and a solvent;
   b. evaporating the solvent from the plating solution;
   c. ink-jet printing onto at least a portion of the first phosphorus layer, an ink comprising silver and glass frit; and
   d. firing the silicon wafer to fuse the frit.

7. The method of claim 6, wherein the plating solution further comprises a metal selected from the group consisting of silver, nickel, iron, cobalt, platinum, palladium, tungsten, molybdenum, gadolinium, yttrium, zirconium, hafnium, titanium, lanthanum, tantalum, niobium, vanadium, iridium, rhodium, and combinations thereof.

8. The method of claim 6, further comprising forming at least one groove in the silicon wafer prior to ink-jet printing the first phosphorus layer.

9. The method of claim 6, wherein the plating solution is ink-jet printed into the at least one groove.

* * * * *